United States Patent
Zai et al.

(10) Patent No.: US 8,836,357 B2
(45) Date of Patent: Sep. 16, 2014

(54) STACKABLE PROBE SYSTEM

(76) Inventors: Li-Cheng Richard Zai, Taipei (TW); Ben Lih-Chung Chia, Taipei (TW)

( * ) Notice: Subject to any disclaimer, the term of this patent is extended or adjusted under 35 U.S.C. 154(b) by 226 days.

(21) Appl. No.: 13/449,974

(22) Filed: Apr. 18, 2012

(65) Prior Publication Data

US 2012/0268151 A1 Oct. 25, 2012

Related U.S. Application Data

(60) Provisional application No. 61/517,617, filed on Apr. 23, 2011.

(51) Int. Cl.
*G01R 31/00* (2006.01)
*G01R 31/28* (2006.01)

(52) U.S. Cl.
CPC ........ *G01R 31/2887* (2013.01); *G01R 31/2891* (2013.01)
USPC ...... 324/750.16; 324/750; 324/755; 324/756; 324/765; 324/158; 29/737

(58) Field of Classification Search
CPC ........ G01R 31/00; G01R 131/20; G01R 1/67; G01R 1/02
USPC ............. 324/750.16, 750.19, 754.07–754.09, 324/754.13, 755.01, 757.01, 696, 725, 724
See application file for complete search history.

(56) References Cited

U.S. PATENT DOCUMENTS

| | | | | |
|---|---|---|---|---|
| 5,026,033 | A * | 6/1991 | Roxy | 269/45 |
| 6,464,393 | B2 * | 10/2002 | Tatoh | 374/179 |
| 7,051,447 | B2 * | 5/2006 | Kikuchi et al. | 33/503 |
| 7,503,125 | B2 * | 3/2009 | Jordil et al. | 33/503 |
| 7,764,079 | B1 * | 7/2010 | Daoudi et al. | 324/754.13 |
| 7,881,896 | B2 * | 2/2011 | Atwell et al. | 702/95 |
| 2008/0231983 | A1 * | 9/2008 | Tokutomi et al. | 360/31 |
| 2008/0265925 | A1 * | 10/2008 | Burcham et al. | 324/758 |
| 2011/0270562 | A1 * | 11/2011 | Ito et al. | 702/94 |

\* cited by examiner

*Primary Examiner* — Arleen M Vazquez
*Assistant Examiner* — Neel Shah
(74) *Attorney, Agent, or Firm* — Pepper Hamilton LLP

(57) ABSTRACT

A probe system includes a plurality of spaced apart height-variable legs, each of which is composed of a stack of blocks magnetically attached to each other, a platen bridging and magnetically secured to the legs, and a probe positioner magnetically attached to the platen. The probe positioner includes an xyz-axes position adjuster mounted on the platen and connected to a first link, a first ball joint interconnecting the first link and a second link, a rotary connector interconnecting the second link and a third link, and a second ball joint connecting the third link to a chuck unit for holding a probe.

17 Claims, 18 Drawing Sheets

STACKABLE PROBE SYSTEM

CROSS-REFERENCE TO RELATED APPLICATION

This application claims priority of U.S. Provisional Patent Application No. 61/517,617 filed on Apr. 23, 2011.

BACKGROUND OF THE INVENTION

1. Field of the Invention

The invention relates to a probe system and, more particularly to a stackable probe system.

2. Description of the Related Art

Probing systems have been used widely in many industries for testing and measurement of devices, such as printed circuit boards and semiconductor wafers. Conventional probing systems are typically customized for specific types of applications with size and configuration limitations. For example, a probing system that is designed for testing small printed circuit boards most likely becomes useless when the circuit boards to be tested exceed a size limitation. A new costly probing system is thus required for large circuit boards.

A prior art modular probe system disclosed in U.S. Pat. No. 7,764,079 contemplates the use of mounting base plates, various mechanical components, and quick-release connectors in order to address the aforesaid problems. However, reconfiguration of such a prior art modular probe system needs a period of about 60 minutes to change from one configuration to a different one. Additionally, this prior art system is unable to support backplanes or motherboards for vertical probing.

Another prior art probe system employs Lego-type modular pieces, which are interconnected through special matching mechanical connection elements. This type of systems is not suitable for probing systems requiring tight tolerance in a gm range.

SUMMARY OF THE INVENTION

An object of the present invention is to provide a probe system, which can be installed conveniently and which has high flexibility in terms of positional adjustment for various applications.

According to one aspect of the invention, a probe system comprises a plurality of spaced apart height-variable legs, each of which is composed of a stack of blocks magnetically attached to each other, a platen bridging and magnetically secured to the tops of the legs, and a probe positioner magnetically attached to the top of the platen.

According to another aspect of the invention, a probe system comprises: a support; an xyz-axes position adjuster mounted on the support and capable of making linear movements relative to the support along directions of x-axis, y-axis and z-axis; a first link having one end connected to the xyz-axes position adjuster; a second link; a first ball joint connected between one end of said second link and the other end of the first link; a third link; a chuck unit adapted to hold a probe; a second ball joint connected between the chuck unit and one end of the third link; and a rotary connector connected rotatably to the other end of the second link and to the other end of the third link.

According to still another aspect of the invention, a probe system comprises: a support; a chuck unit adapted to hold a probe; a first link mounted on the support; a second link; a first ball joint having a first ball disposed on one end of the first link, and a first ball socket disposed on one end of the second link and receiving the first ball; a third link; a second ball joint having a second ball disposed on the chuck unit, and a second ball socket disposed on one end of the third link and receiving the second ball; a first sleeve disposed on the other end of the second link and having a first sleeve hole; a second sleeve disposed on the other end of the third link and having a second sleeve hole aligned with the first sleeve hole; two pusher rods, one of which extends through the second link from the first ball socket and into the first sleeve hole, and the other of which extends through the third link from the second ball socket and into the second sleeve hole; a first press member inserted movably into one of the first and second link sleeve holes and having a first cam face to contact one of the pusher rods; a second press member inserted movably into the other one of the first and second link sleeve holes and having a second cam face to contact the other one of the pusher rods; a tightening screw rod connected to the second press member and extending through the first and second sleeve holes and the first press member; and an operating knob disposed around the tightening screw rod at one side of the first press member opposite to the second press member and having a threaded hole threadedly engaging the tightening screw rod. When the operating knob is rotated relative to the tightening screw rod to move the first press member toward the second press member, the first and second cam faces respectively press the pusher rods, the pusher rods respectively press the first and second balls, and the first and second sleeves are immobilized relative to each other.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
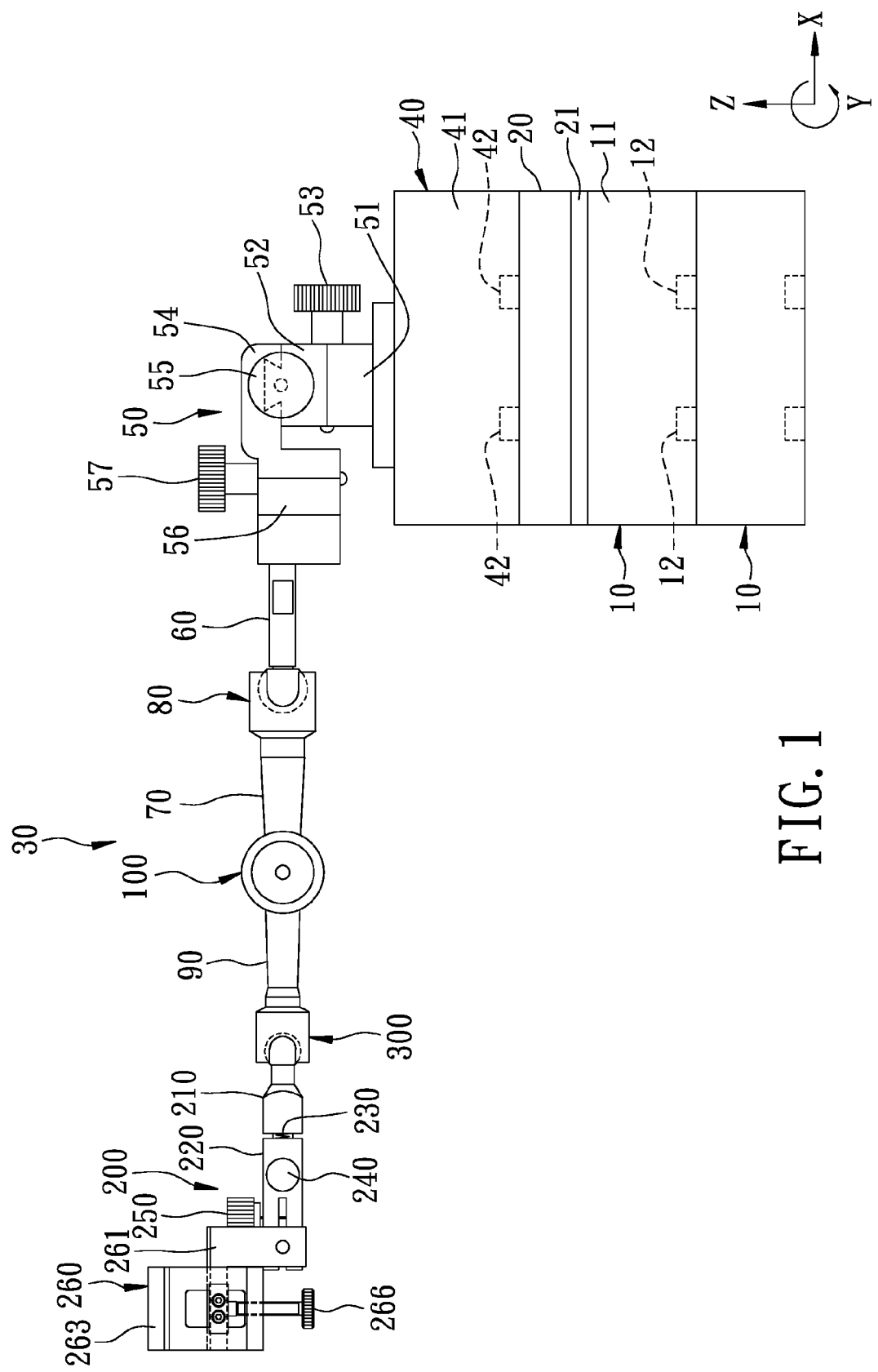
FIG. 1 is an elevation view of a probe system according to a preferred embodiment of the invention.
Figure 2:
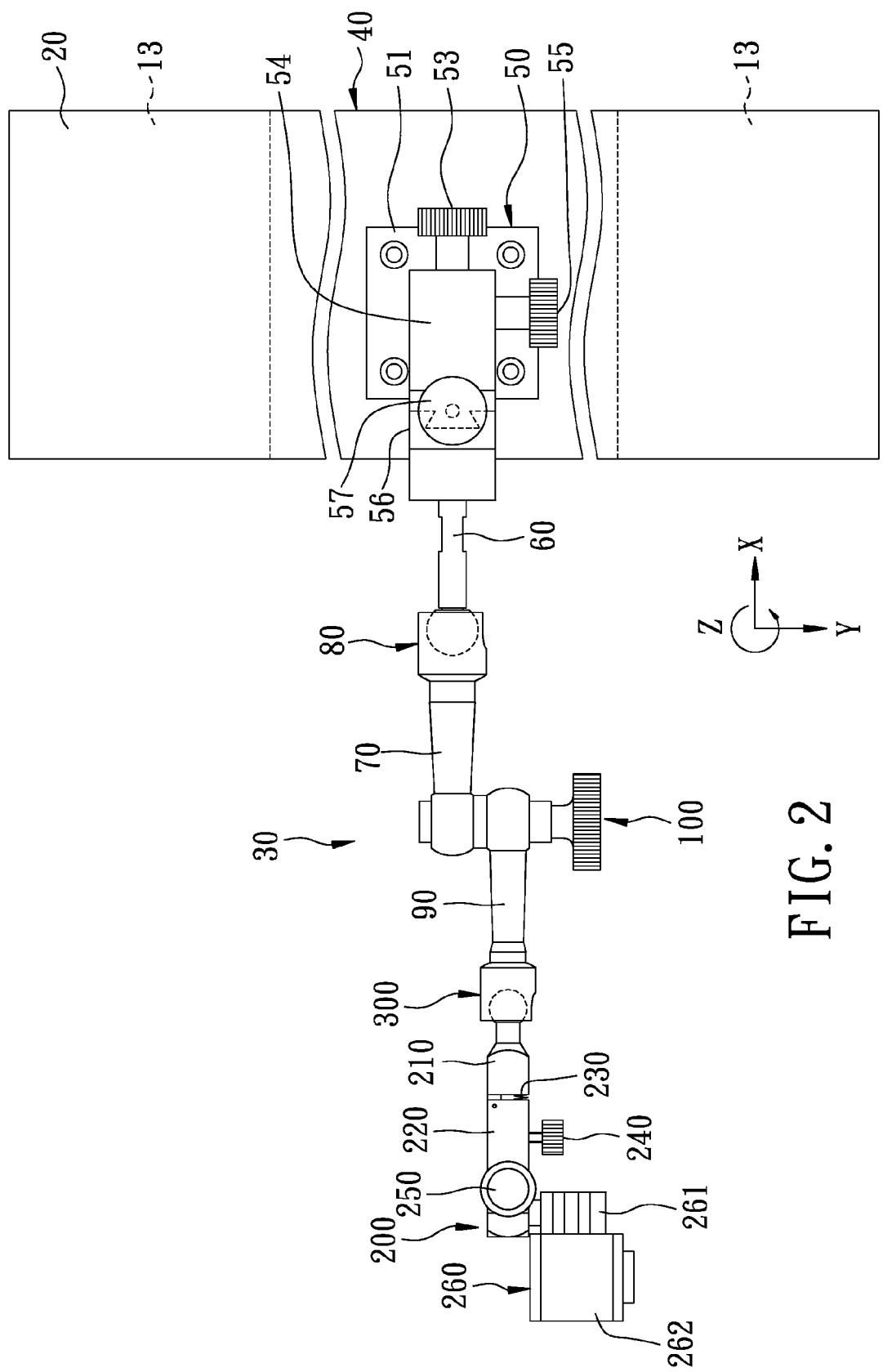
FIG. 2 is a plan view of the probe system.
Figure 3:
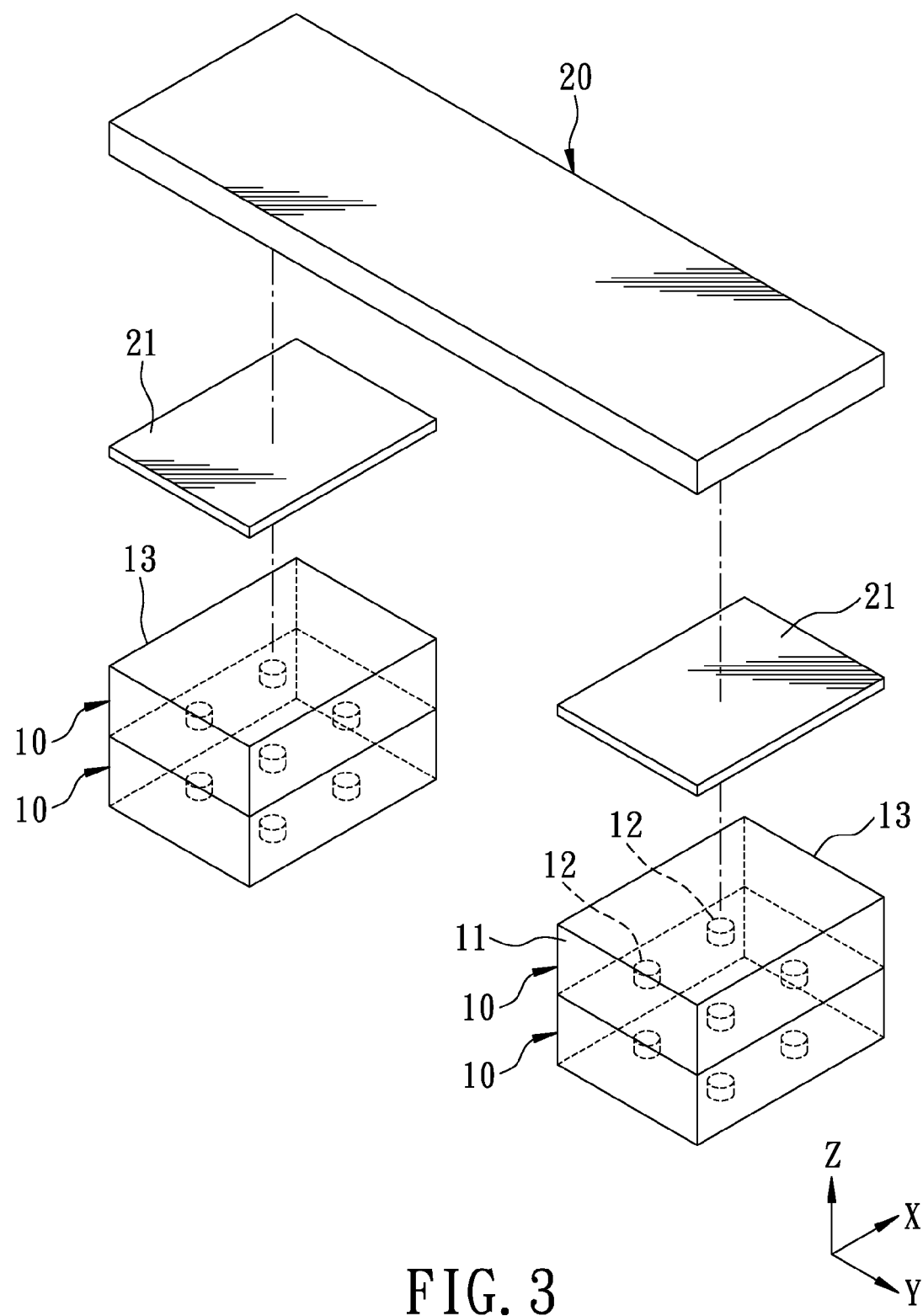
FIG. 3 is an exploded view showing a support of the probe system.

Referring to FIGS. 1 to 3, a stackable probe system according to a preferred embodiment of the present invention comprises a probe positioner 30 mounted on a support that has a pair of spaced apart height-variable legs 13, a platen 20, and two magnetic plates 21.

Each leg 13 is composed of a stack of blocks 10 magnetically attached to each other to form an upright structure. Each block 10 includes a block body 11, and a plurality of magnets 12 attached to the block body 10. In this embodiment, the block body 11 is magnetizable and may be made of a magnetizable metal.

The platen 20 is disposed on top of the legs 13 in a bridging fashion and is magnetically secured to the legs 13. In this embodiment, the platen 20 is magnetizable and may be made of a magnetizable metal.

Each of the two magnet plates 21 is disposed between the platen 20 and a top one of the blocks 10 of one of the legs 13 to magnetically interconnect the platen 20 and the top one of the blocks 10.

The probe positioner 30 is disposed on top of the platen 20, and includes a positioner base 40 magnetically secured to the top of the platen 20, an xyz-axes position adjuster 50 mounted on the positioner base 40, a first link 60 connected to the xyz-axes position adjuster 50, a second link 70, a first ball joint 80 connected between the first and second links 60, 70, a third link 90, a rotary connector 100 connected between the second and third links 70, 90, a chuck unit 200, and a second ball joint 300 connected between the third link 90 and the chuck unit 200.

The positioner base 40 includes a base body 41 and a plurality of magnets 42 disposed in a bottom side of the base body 41 to magnetically connect the base body 41 to the platen 20. The base body 41 is magnetizable and may be made of metal.

Figure 4:
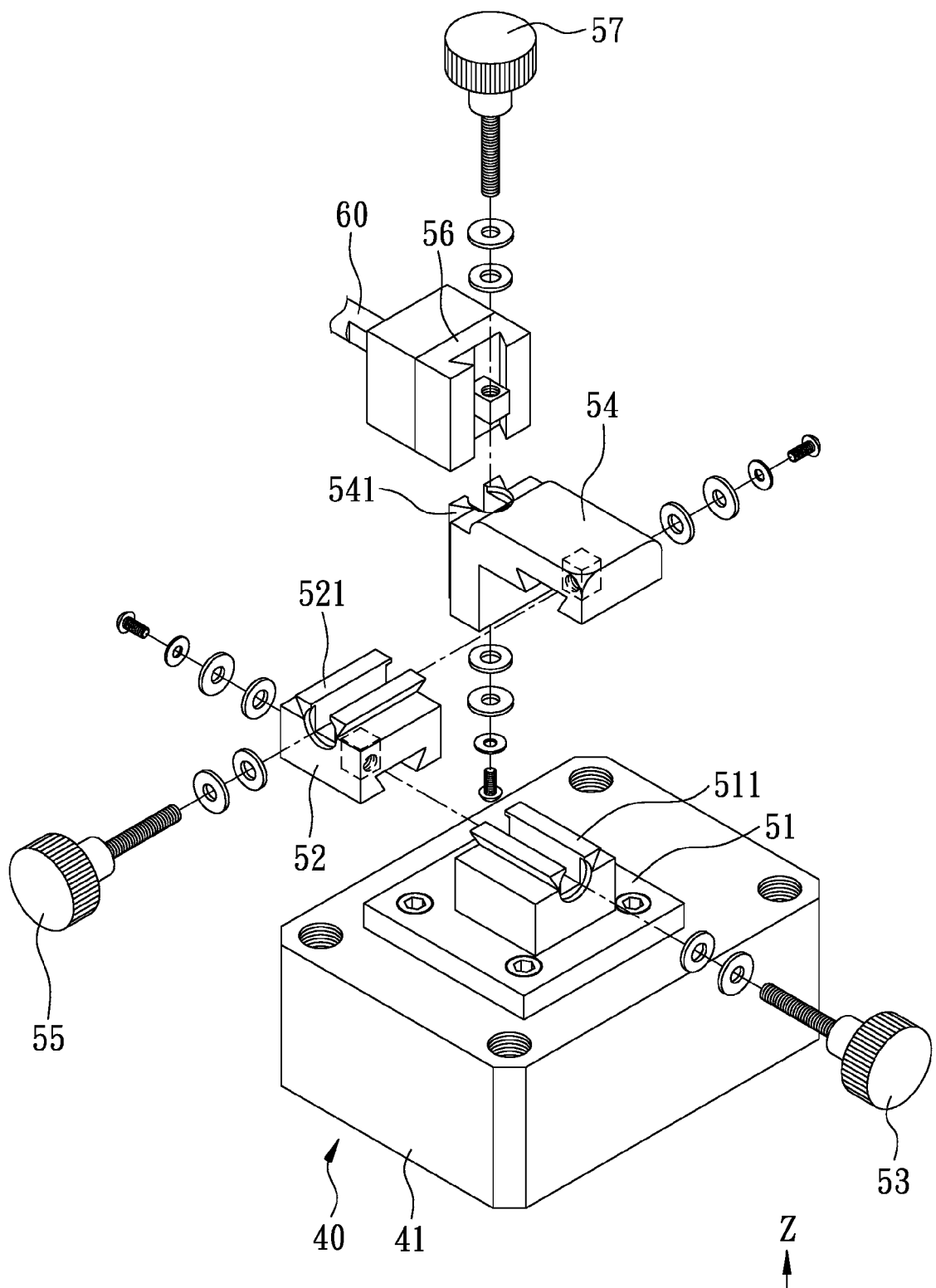
FIG. 4 is an exploded view showing an xyz-axes position adjuster of the probe system.
Figure 5:
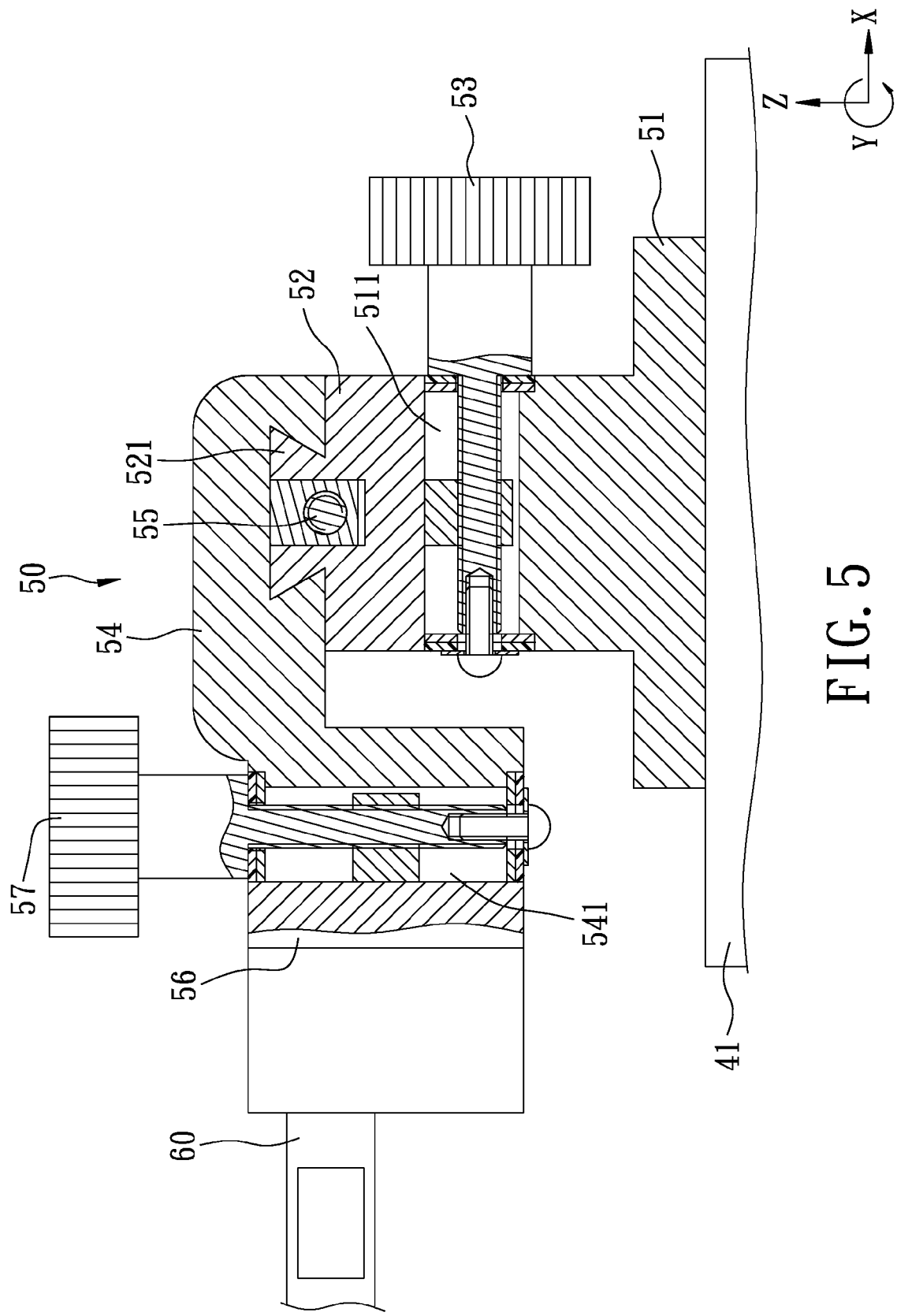
FIG. 5 is a sectional view showing the xyz-axes position adjuster of the probe system.

Referring to FIGS. 4 and 5, the xyz axes position adjuster 50 includes an adjuster base 51 that is secured to the positioner base 40 and that has a first guide rail 511 extending in an x-axis direction, a first slide 52 engaging slidably the first guide rail 511 and having a second guide rail 521 extending in a y-axis direction, a first adjuster screw 53 attached rotatably to the adjuster base 51 to extend in the x-axis direction and threadedly engaging the first slide 52, a second slide 54 engaging slidably the second guide rail 521 and having a third guide rail 541 extending in a z-axis direction, a second adjuster screw 55 attached rotatably to the first slide 52 to extend in the y-axis direction and threadedly engaging the second slide 54, a third slide 56 engaging slidably the third guide rail 541, and a third adjuster screw 57 attached rotatably to the second slide 54 to extend in the z-axis direction and threadedly engaging the third slide 56. When the first adjuster screw 53 is rotated, the first slide 52 can be moved relative to the adjuster base 51 in the x-axis direction. When the second adjuster screw 55 is rotated, the second slide 54 can be moved relative to the first slide 52 in the y-axis direction. When the third adjuster screw 57 is rotated, the third slide 56 can be moved relative to the second slide 54 in the z-axis direction.

Figure 6:
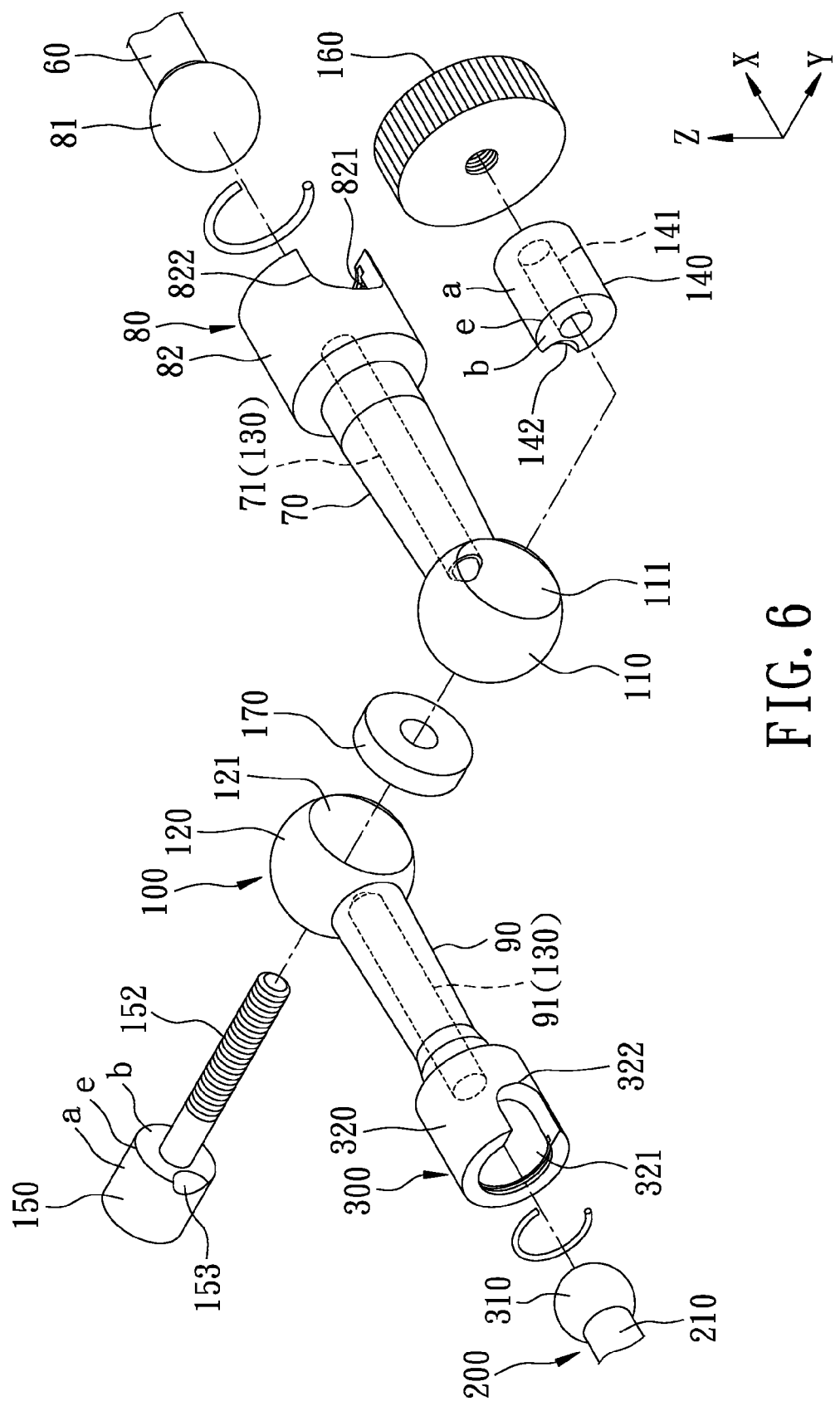
FIG. 6 is an exploded view showing first, second and third links and a rotary connector of the probe system.
Figure 7:
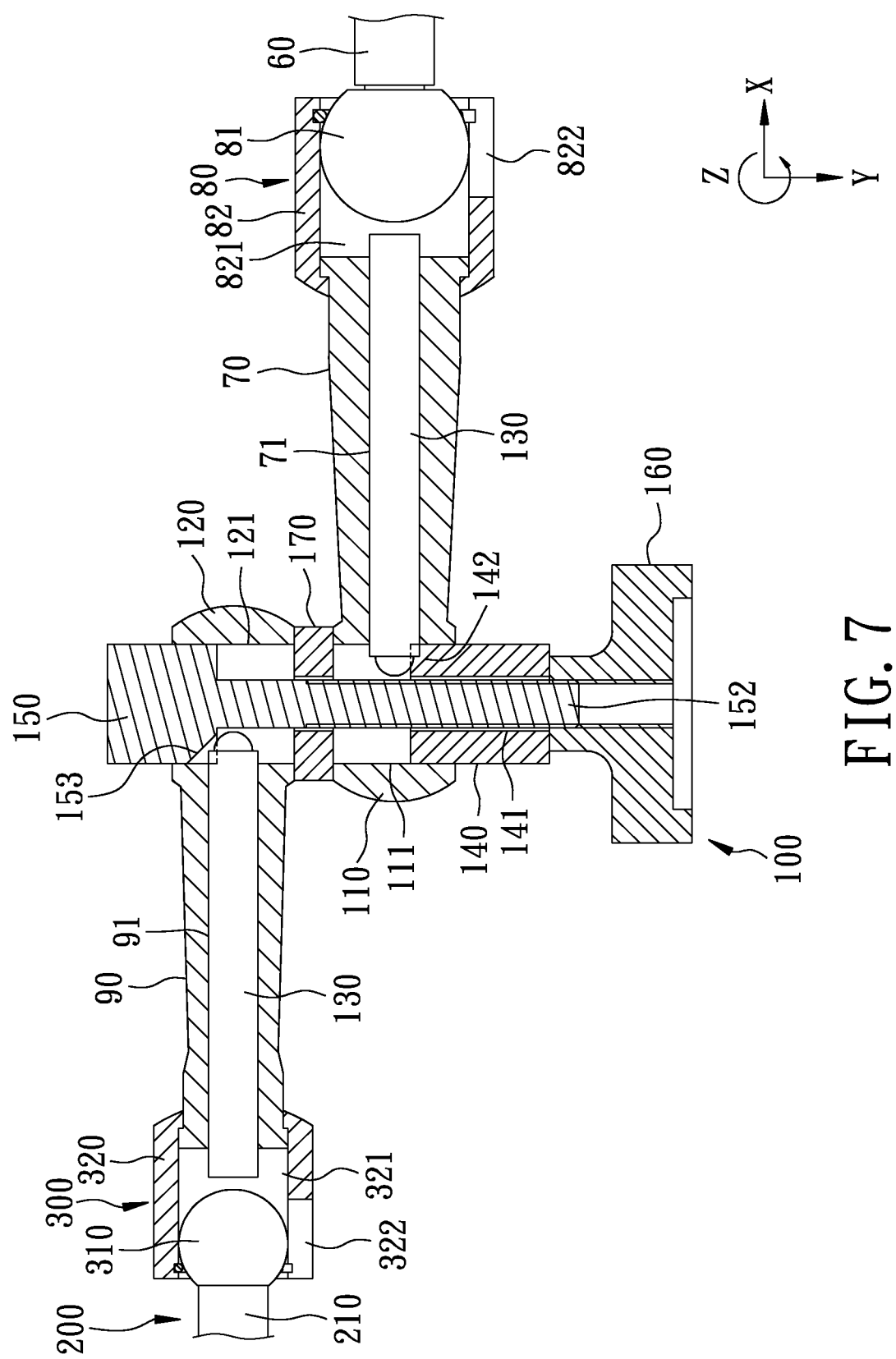
FIG. 7 is a sectional view showing the first, second and third links and the rotary connector of the probe system.

As shown in FIGS. 1 and 5, the first link 60 is connected to the third slide 56. Referring to FIGS. 6 and 7, the first ball joint 80 has a first ball 81 connected to one end of the first link 60 for connection with the second link 70, and a first ball socket 82 connected rotatably to one end of the second link 70. The first ball socket 82 has a cavity 821 to receive rotatably the first ball 81, and a notch 822 to permit the first link 60 to turn an angle with respect to the second link 70. The second link 70 has a second link hole 71 extending longitudinally therein from the cavity 821 of the first ball socket 82 to the other end of the second link 70.

The second ball joint 300 has a second ball 310 connected to the chuck unit 200, and a second ball socket 320 connected rotatably to one end of the third link 90. The second ball socket 320 has a cavity 321 to receive the second ball 310, and a notch 322 to permit a chuck end piece 210 of the chuck unit 200 to turn an angle with respect to the third link 90. The third link 90 has a third link hole 91 extending longitudinally therein from the cavity 321 of the second ball socket 320 to the other end of the third link 90 connected to the chuck end piece 210.

The rotary connector 100 includes a first sleeve 110 that is disposed at the other end of the second link 70 connected to the third link 90 and that has a first sleeve hole 111 communicated with the second link hole 71, a second sleeve 120 that is disposed at the other end of the third link 90 and that has a second sleeve hole 121, which is communicated with the third link hole 91 and is aligned with the first sleeve hole 111, two pusher rods 130, one of which extends in the x-axis direction through the second link hole 71 from the cavity 821 of the first ball socket 82 and into the first sleeve hole 111 and the other of which extends in the x-axis direction through the third link hole 91 from the cavity 321 of the second ball socket 320 and into the second sleeve hole 121, a first press member 140 inserted movably into the first link sleeve hole 111 to move in the y-axis direction and having a bore 141 and a first cam face 142 to contact one of the pusher rods 130, a second press member 150 inserted movably into the second link sleeve hole 121 to move in the y-axis direction and having a second cam face 153 to contact the other one of the pusher rods 130, a tightening screw rod 152 connected to the second press member 150 and extending in the y-axis direction transverse to the pusher rods 130 and passing through the first and second sleeve holes 111, 121 and the bore 141 of the first press member 140, and a connector tightening knob 160 threadedly engaging the tightening screw rod 152 and disposed at one side of the first press member 140 opposite to the second press member 150. A packing ring 170 is disposed between the first and second sleeves 110, 120.

In a preferred embodiment, each of the first and second press members 140, 150 has a rounded peripheral surface (a) in sliding contact with an inner surface of a respective one of the first and second sleeves 140, 150, an inner end face (b) formed transversely of the rounded peripheral surface (a) within a respective one of the first and second sleeve holes 111, 121, and a corner edge (e) formed at a junction of the inner end face (b) and the rounded peripheral surface (a). The corner edges (e) of the first and second press members 140, 150 are notched to respectively form the first and second cam faces 142, 153 therein.

Figure 8:
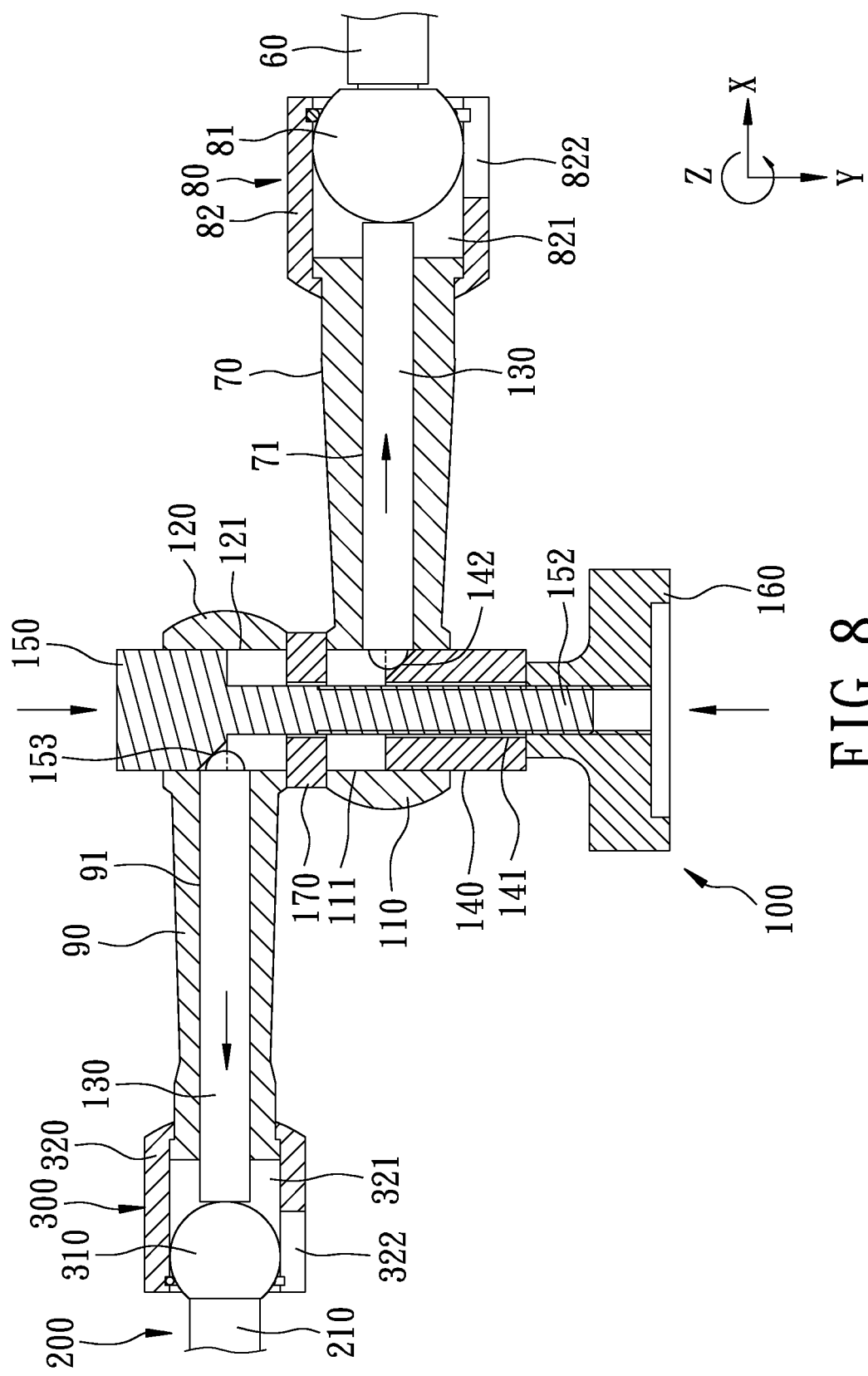
FIG. 8 is the same view as FIG. 7 but showing that the rotary connector is tightened.
Figure 9:
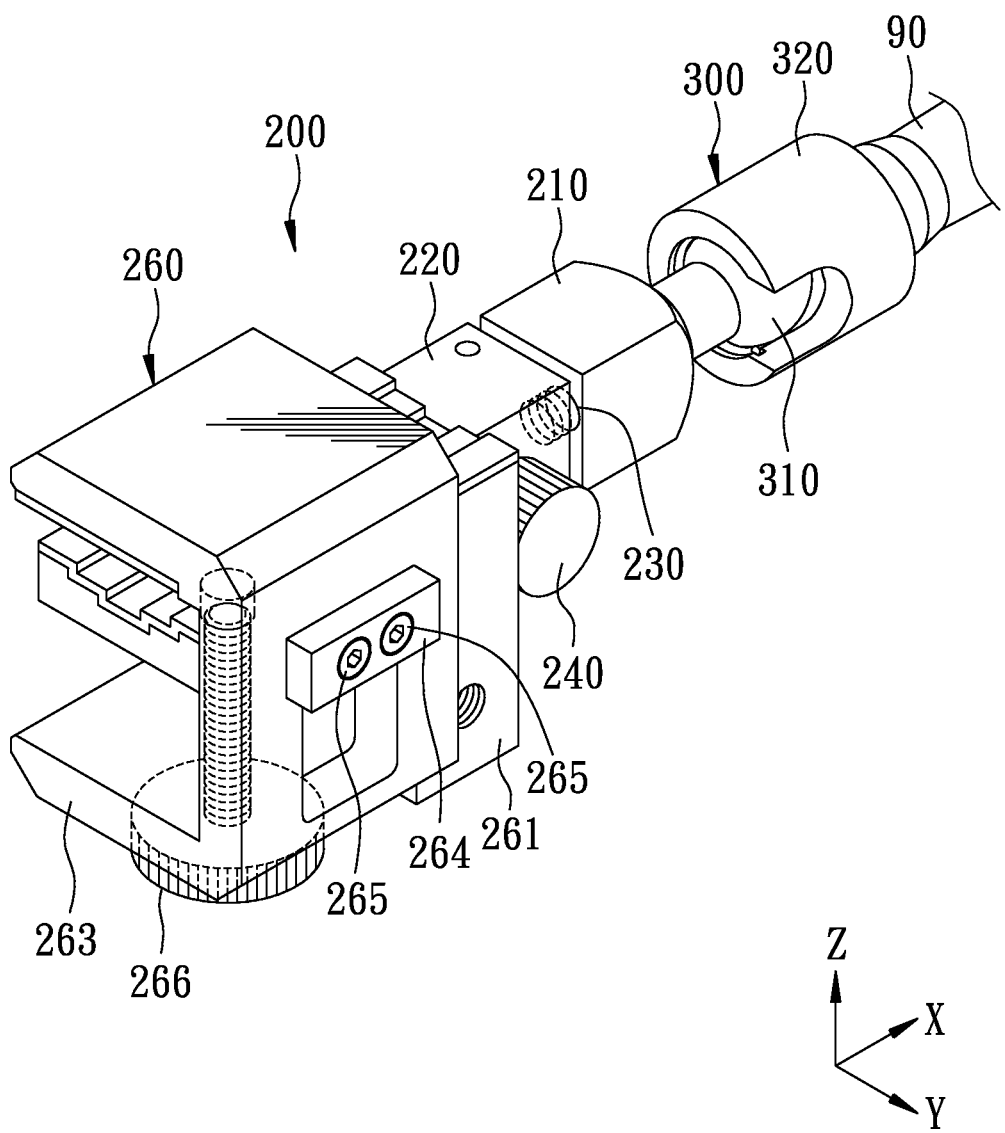
FIG. 9 is a perspective view showing a chuck unit of the probe system.

Referring to FIG. 8, when the connector tightening knob 160 is rotated to abut against and move the first press member 140 toward the second press member 150, the first and second cam faces 142, 153 abut against and move the respective pusher rods 130 so that the pusher rods 130 press the first and second balls 81, 310 against the first and second ball sockets 82, 320, respectively, limiting the relative movements between the first and second sleeves 110,120, the relative movements between the first ball 81 and the first ball socket 82, and the relative movements between the second ball 310 and the second ball socket 320. Accordingly, all of the first and second ball joints 80, 300 and the rotary connector 100 are tightened. As a result, the second link 70 is locked against movements relative to the first link 60, the third link 90 is locked against movements relative to the second link 70, and the chuck unit 200 is locked against movements relative to the third link 90. Therefore, by manipulating the connector tightening knob 160, the first, second and third links 60, 70, 90 and the chuck unit 200 can be fixed at their particular positions as desired.

Referring back to FIG. 7, when the connector tightening knob 160 is loosened, it does not push the first press member 140, and the first and second cam faces 142, 153 release the respective pusher rods 130. Accordingly, the first and second balls 81, 130 are released, and the first and second ball joints 80, 300 and the rotary connector 100 are loosened. Therefore, by loosening the connector tightening knob 160, the positions of the first, second and third links 60, 70, 90 and the chuck unit 200 can be adjusted.

Figure 17:
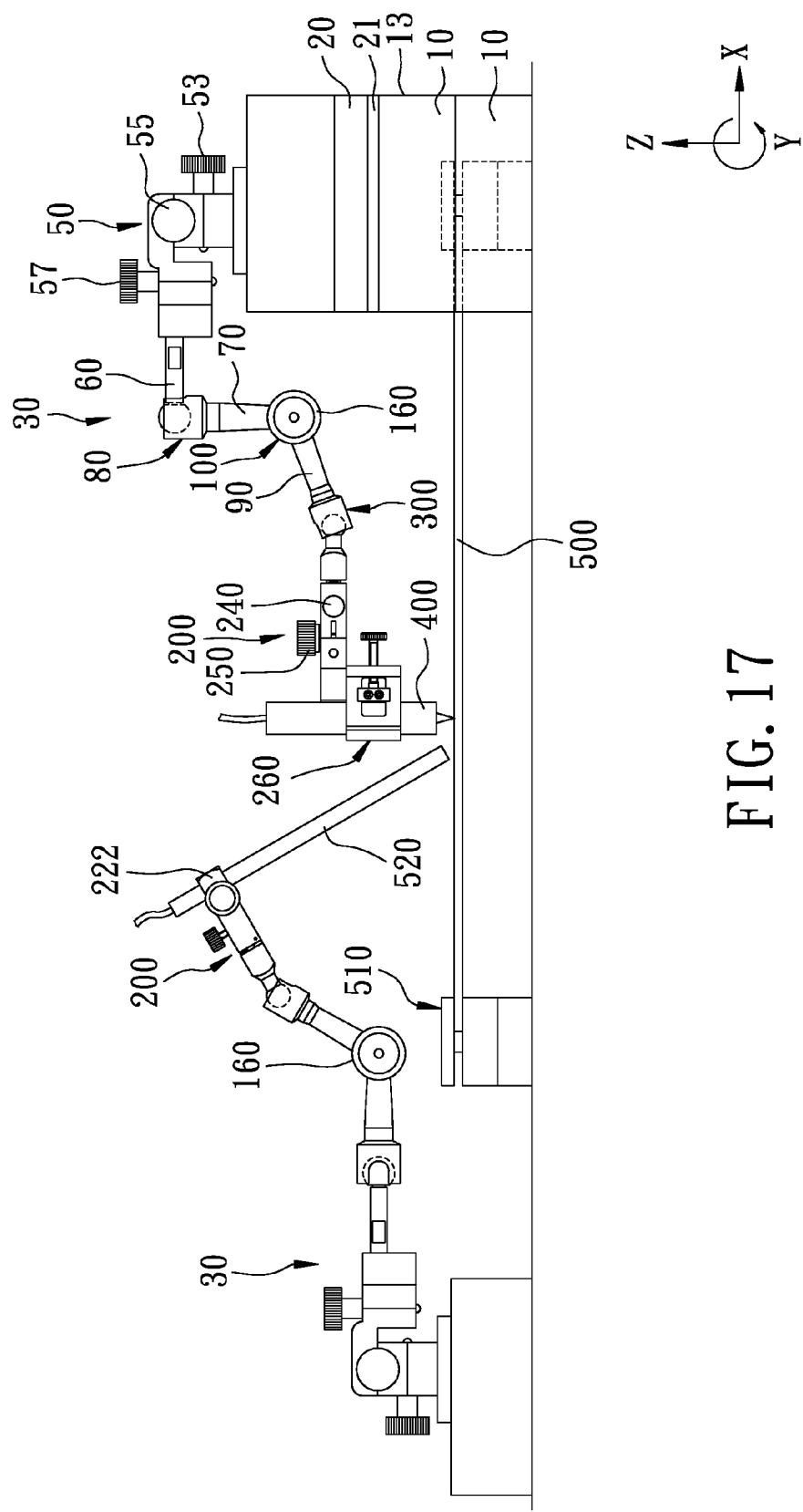
FIG. 17 illustrates the probe system used to perform a horizontal probing operation mode.

Referring to FIGS. 9 to 12, the chuck unit 200 includes the chuck end piece 210 connected to the second ball 310, a chuck head clamp 220 connected pivotally to the chuck end piece 210, a biasing spring (compression spring) 230 disposed between the chuck end piece 210 and the chuck head clamp 220, an inclination adjusting screw 240 attached to the chuck head clamp 220, a chuck head clamping screw 250 attached to the chuck head clamp 220, and a chuck head 260 clamped releasably by the chuck head clamp 220 for clamping a probe 400 (see FIG. 17).

The chuck end piece 210 has a base section 211 connected to the second ball 310, and a first pivot section 212 extending from the base section 211.

The chuck head clamp 220 includes a second pivot section 221 connected pivotally to the first pivot section 212 and spaced apart from the base section 211 and a clamp section 222 connected to the second pivot section 22. The second pivot section 221 is substantially U-shaped in cross section, and has two arm sections 223, a bight section 224 interconnecting the arm sections 223, and a fulcrum groove 226 defined by the arm sections 223 and the bight section 224 to receive the first pivot section 212. The bight section 224 has a screw hole 225 communicated with the fulcrum groove 226. The first pivot section 212 is fulcrumed to the arm sections 223 in the fulcrum groove 226.

The clamp section 222 includes two substantially parallel clamp elements 227 projecting from the second pivot section 221 and defining therebetween a clamping gap, and a through hole 228 and a screw hole 229 formed respectively in the clamp elements 227.

The compression spring 230 has one end abutting against the base section 211 and the other end abutting against the bight section 224. The compression spring 230 provides a biasing force to induce a relative turning movement between the base section 211 and the second pivot section 221. The inclination adjusting screw 240 is engaged threadedly with the screw hole 225 and is extended into the fulcrum groove 226 to abut against the first pivot section 212. By rotating the inclination adjusting screw 240, an inclining angle of the chuck head clamp 220 with respect to the chuck end piece 210 can be adjusted.

Figure 13:
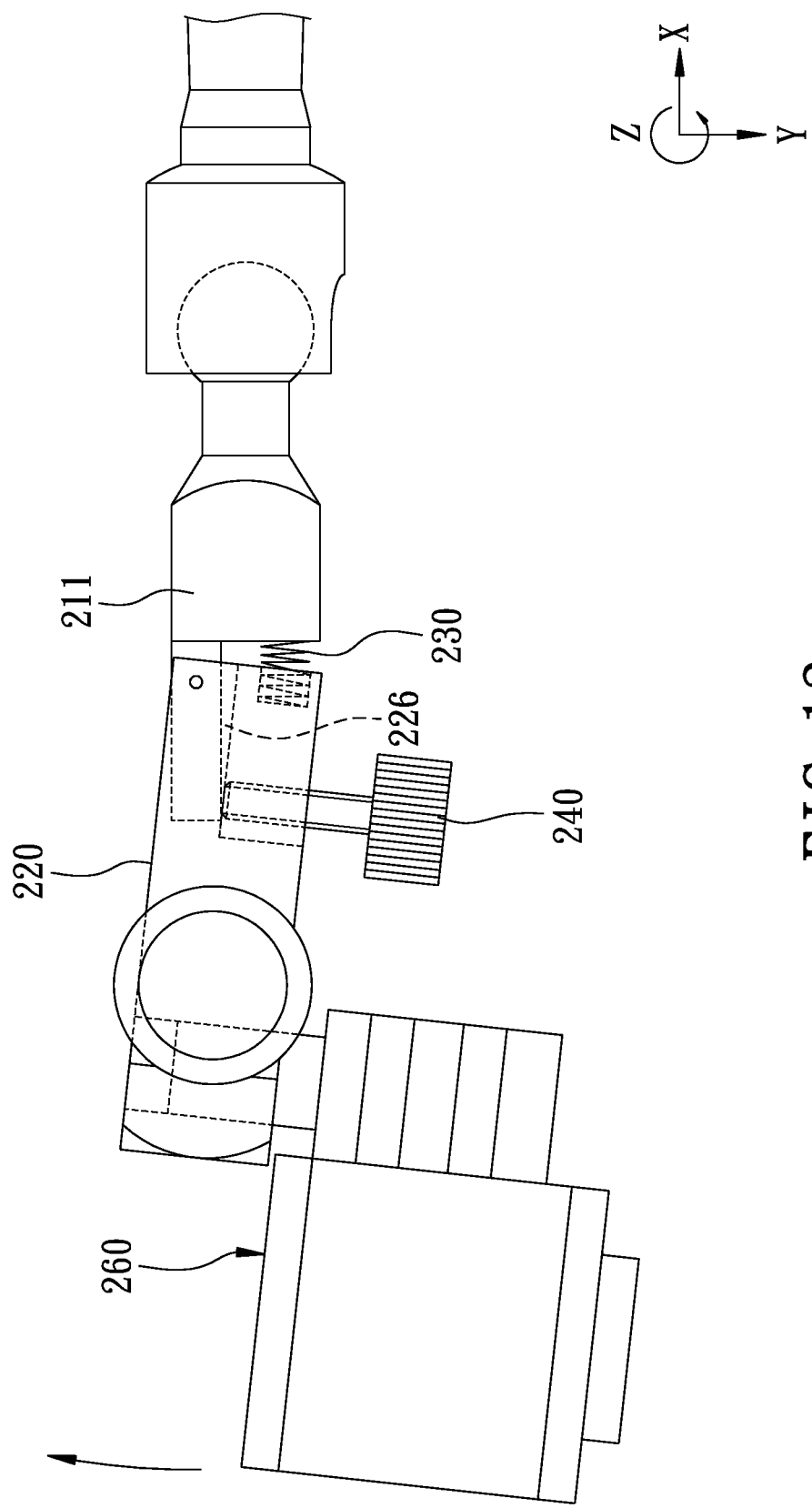
FIG. 13 is the same view as FIG. 11 but showing that a chuck head is turned clockwise.
Figure 14:
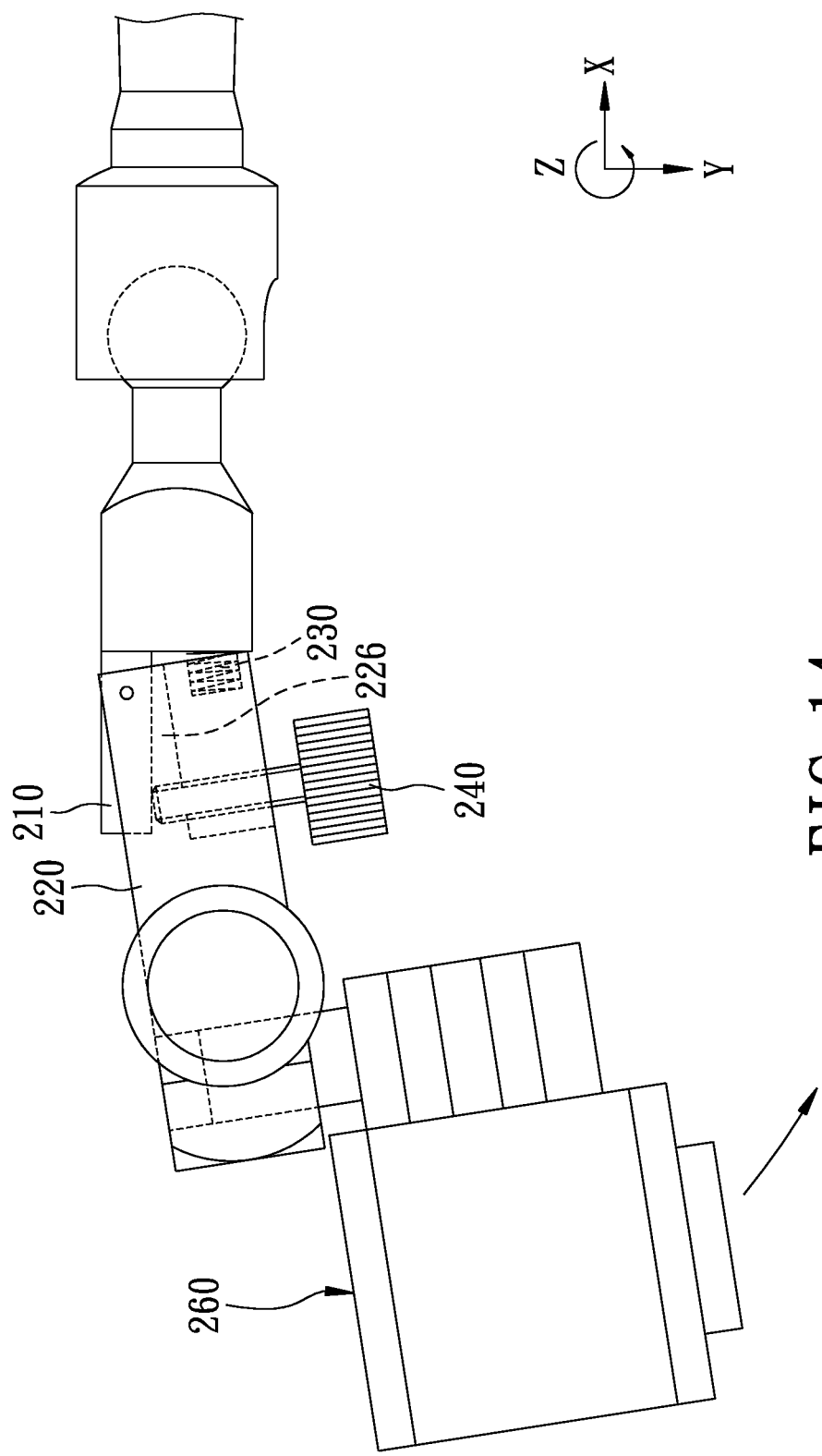
FIG. 14 is the same view as FIG. 11 but showing that a chuck head is turned counterclockwise.

Referring to FIG. 13, when the inclination adjusting screw 240 is rotated to move backward or out of the fulcrum groove 226, the compression spring 230 biases the chuck head clamp 220 to rotate clockwise relative to the chuck end piece 210. Accordingly, the chuck head 260 can be rotated clockwise about the z-axis. Referring to FIG. 14, when the inclination adjusting screw 240 is rotated to move forward or into the fulcrum groove 226 so as to push the first pivot section 211 of the chuck end piece 210, the compression spring 230 biases the chuck head clamp 220 to rotate counterclockwise relative to the chuck end piece 210. Accordingly, the chuck head 260 can be rotated counterclockwise about the z-axis, and the compression spring 230 is compressed. By operating the inclination adjusting screw 240, the chuck head 260 may be rotated about the z-axis to change the position of the probe 400 (see FIG. 17).

Figure 11:
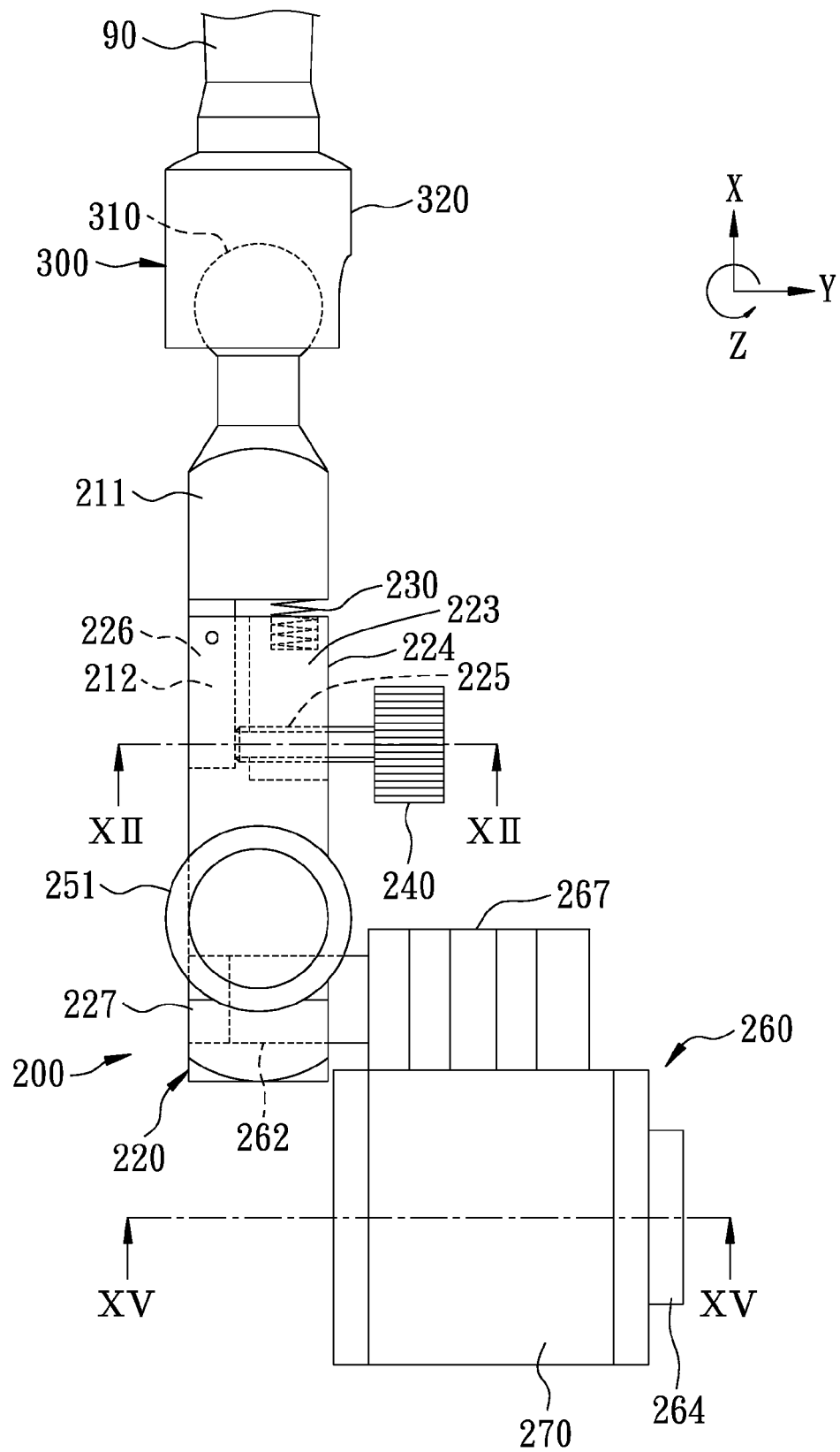
FIG. 11 is a plan view of the chuck unit.
Figure 12:
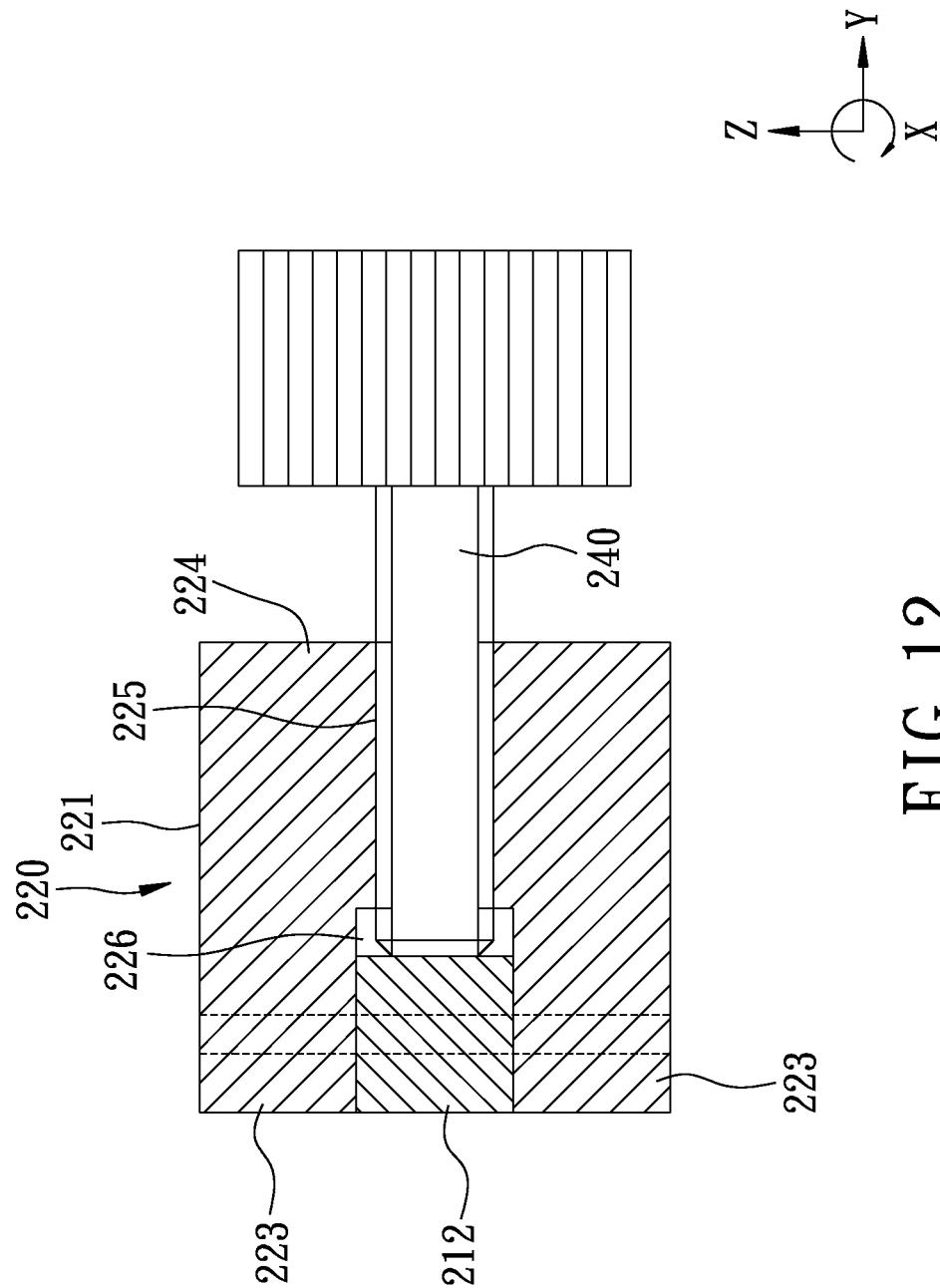
FIG. 12 is a sectional view taken along line XII-XII of FIG. 11.
Figure 15:
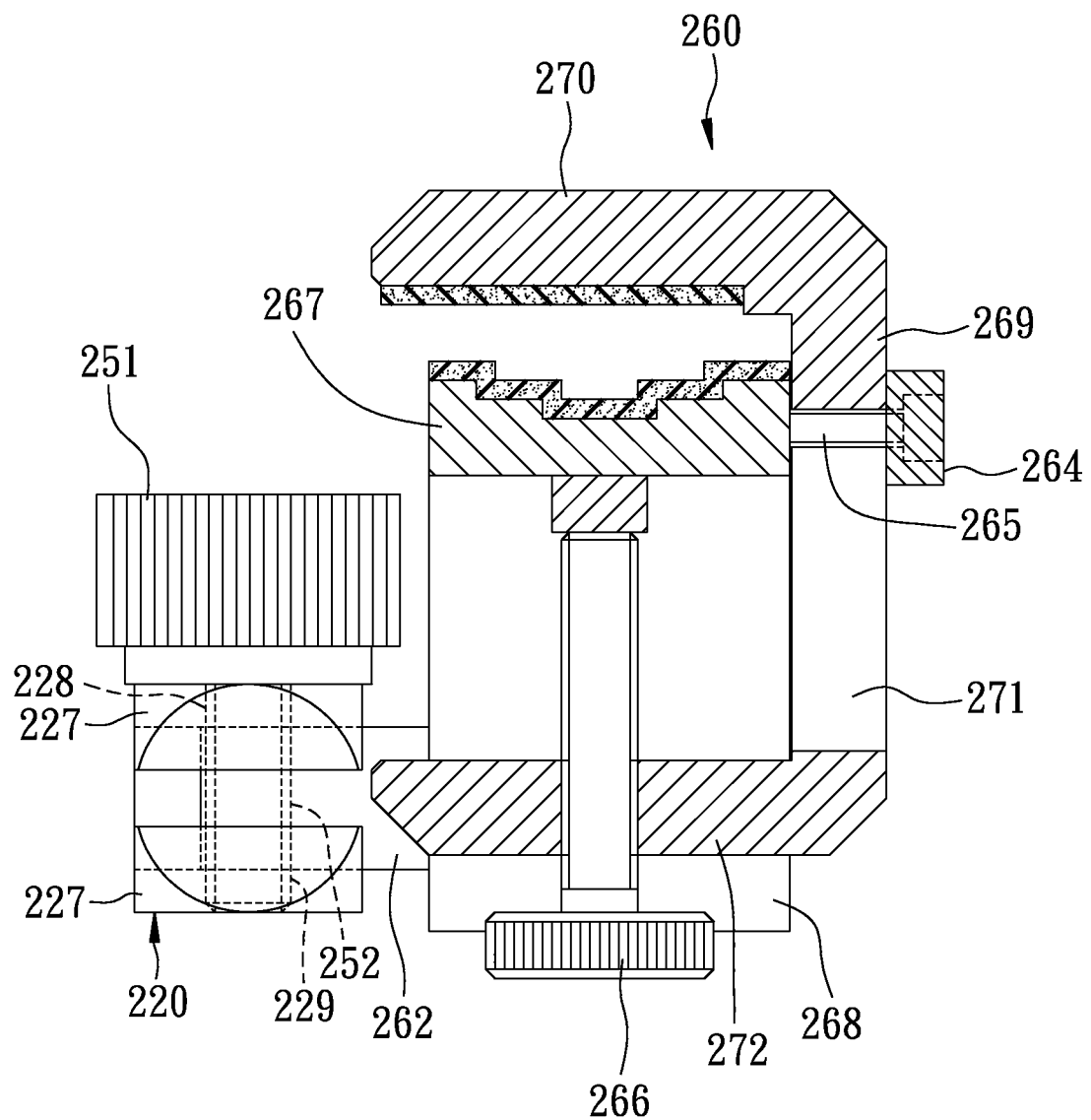
FIG. 15 is a sectional view taken along line XV-XV of FIG. 11.

Referring to FIGS. 11 and 15, the chuck head clamping screw 250 has an operating knob 251, and a threaded section 252 connected to the operating knob 251 and extending through the through hole 228 and the screw hole 229. The chuck head 260 includes a first jaw component 261, a chuck stem 262 connected to the first jaw component 261 and clamped between the clamp elements 227, a second jaw component 263 attached movably to the first jaw component 261, and a jaw adjusting screw 266 attached to the second jaw component 263. The first jaw component 261 is configured as an L-shape and has a first jaw plate 267 and a first jaw leg 268 extending transversely from one end of the first jaw plate 267. The chuck stem 262 is connected to the first jaw leg 268. The chuck stem 262 extends transversely from one side face of the first jaw leg 268, and the first jaw plate 267 extends transversely from another side face of the first jaw leg 268. The first jaw plate 267 thus extends transversely relative to the first jaw plate 267. When the chuck head clamping screw 250 is tightened to place the operating knob 251 in abutment with one of the clamp elements 227, the clamp elements 227 are moved toward each other and tightly holding the chuck stem 262 therebetween. When the chuck head clamping screw 250 is loosened, the chuck stem 262 is released so that the chuck stem 262 may be rotated to turn the first and second jaw components 261, 263 about the y-axis so as to change the pointing direction of the probe 400 (see FIGS. 17, 18).

The second jaw component 263 is configured as a U-shape, and has a second jaw leg 269, and a second jaw plate 270 and a second jaw foot 272 extending transversely and respectively from two opposite ends of the second jaw leg 269 in a spaced apart manner. The first jaw plate 267 is disposed between the second jaw plate 270 and the second jaw foot 272. A guide hole 271 is formed in the second jaw leg 269.

The first jaw component 261 further has a guide block 264, and two guide bolts 265 extending threadedly through the guide block 264 and connected threadedly to the first jaw plate 267. The guide bolts 265 also extend through the guide hole 271 so that the second jaw leg 269 is disposed movably between the first jaw plate 267 and the guide block 264.

The jaw adjusting screw 266 is attached to the second jaw foot 272 and is extended to the second jaw plate 270. When the jaw adjusting screw 266 is rotated to move inwardly, the first jaw plate 267 is pushed upward and toward the second jaw plate 270 so that the gap between the first and second jaw plates 267 and 270 may be reduced. Conversely, when the jaw adjusting screw 266 is rotated to move outwardly, the first jaw plate 267 can be moved away from the second jaw plate 270 to enlarge the gap between the first and second jaw plates 267 and 270.

Figure 16:
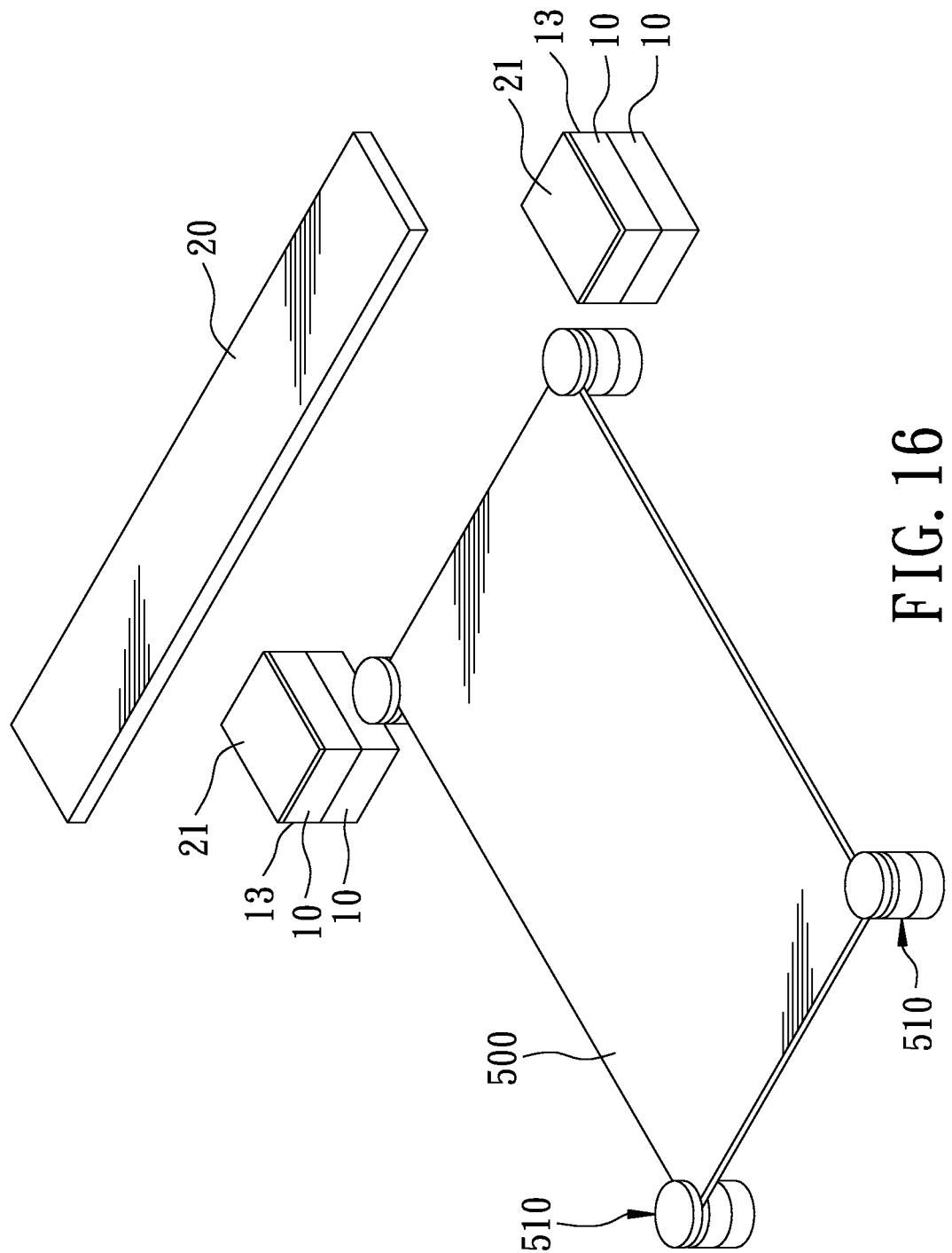
FIG. 16 illustrates that the legs of the support in the probe system are installed for a horizontal probing operation mode.

Referring to FIGS. 16 and 17, one probe positioner 30 is used to position the probe 400 for performing a horizontally probing mode, and another probe positioner 30 is used to position an electronic microscope 520 for imaging the probe 400 during its operation. The two probe positioners 30 may be connected to and controlled by a computer (not shown). Four clamps 510 are used to hold the circuit board 500. The blocks 10 are arranged in two stacks to form two legs 13 at two sides of the circuit board 500. The platen 20 is secured to the two legs 13 in a bridging fashion.

The probe positioner 30 holding the probe 400 is secured to the platen 20. The second link 70 is turned downward relative to the first link 60 and is rotated an angle relative to the third link 90 from its position shown in FIG. 1 by loosening and re-tightening the rotary connector 160. The position of the chuck head 260 is changed from that shown in FIG. 1 by loosening the chuck head clamping screw 250 to release and rotate the chuck stem 262 and by re-tightening the chuck head clamping screw 250. An initial positioning of the probe 400 is thus achieved to direct the needle of the probe 400 toward the circuit board 500. The position of the probe 400 may be micro-adjusted, if necessary, by manipulating the inclination adjusting screw 240. In addition, the first, second and/or third adjuster screws 53, 55, 57 may be manipulated to adjust the position of the probe 400 relative to the circuit board 500.

Figure 10:
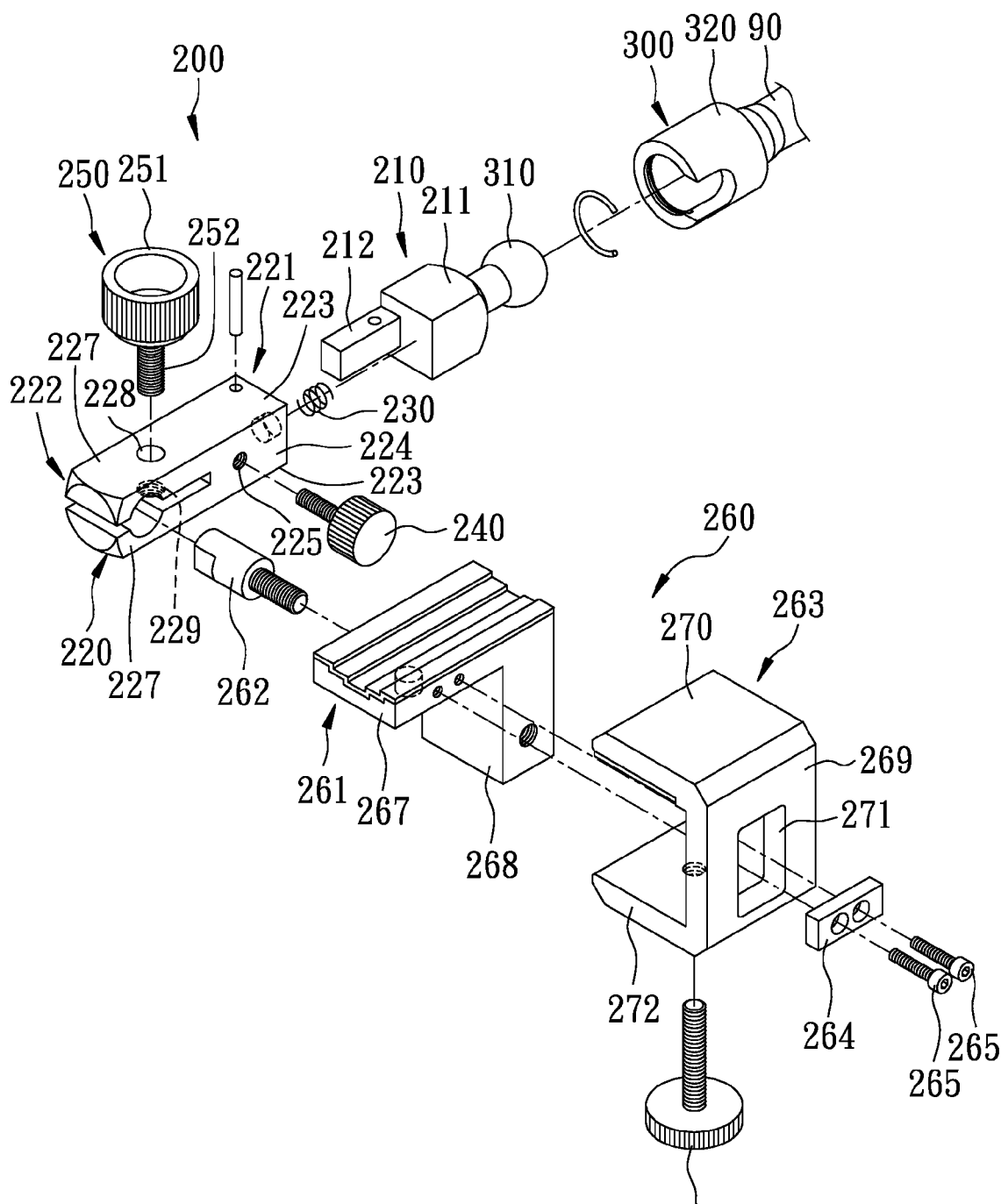
FIG. 10 is an exploded view of the chuck unit.

The electronic microscope 520 is attached to the respective probe positioner 30 by removing the chuck stem 262 (FIG. 10) from the clamp section 222 of the chuck head clamp 220 and by clamping the electronic microscope 520 between the clamp elements 227 (FIG. 10).

The probe positioner 30 may also be used to manipulate the probe 400 to perform a vertical probing mode on a motherboard (not shown) installed in a computer housing (not shown). An operator may open a side cover of the computer housing, place an opening of the computer housing upward by laying down the computer housing, and increase the heights of the two legs 13 to be higher than the computer housing by stacking additional blocks 10. The probe 400 can thus be extended into the computer housing for the vertical probing operation mode. It is not necessary to disassemble the motherboard from the computer housing.

Figure 18:
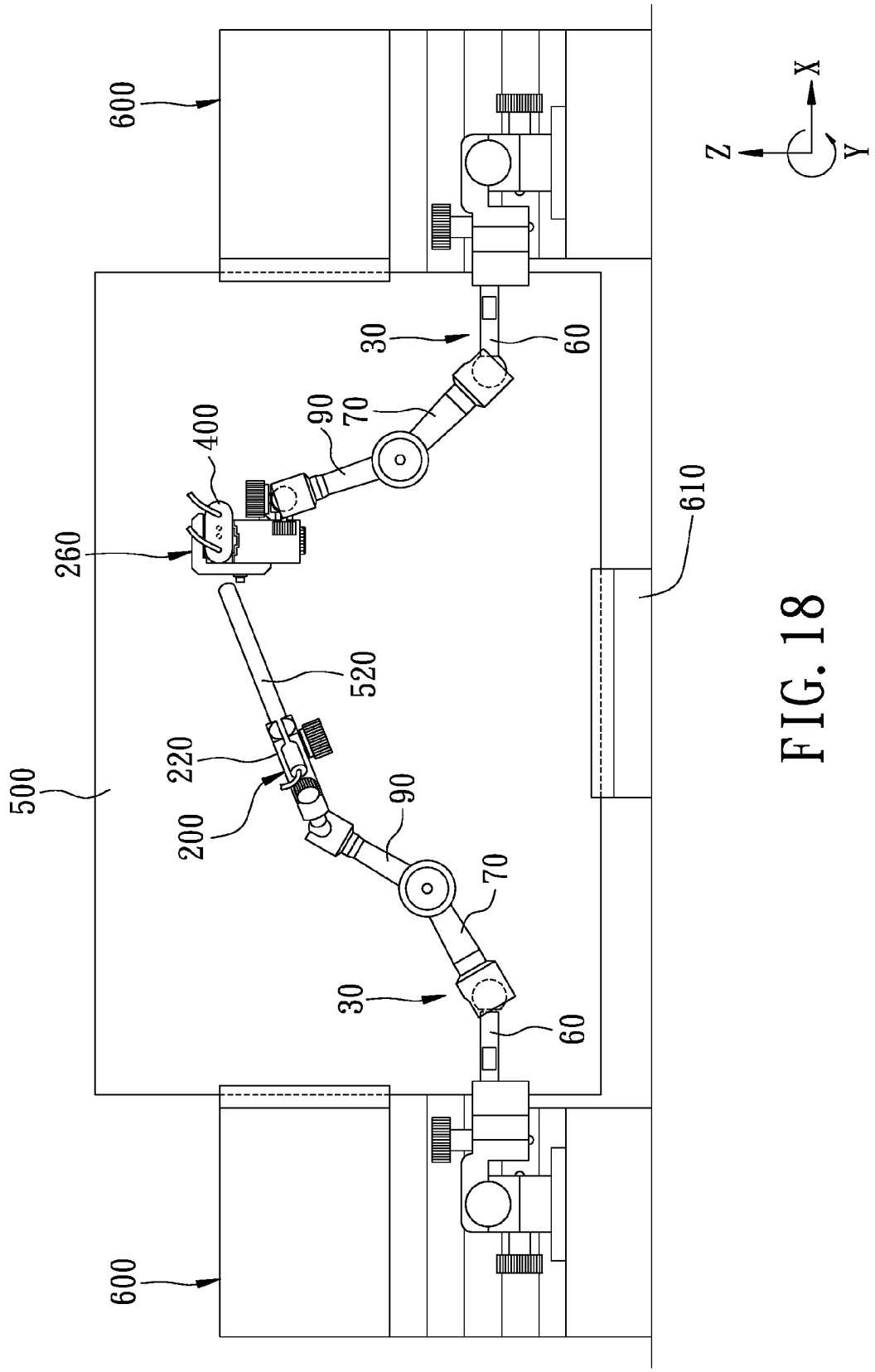
FIG. 18 illustrates the probe system used to perform a vertical probing operation mode.

Referring to FIG. 18, the probe positioners 30 may also be used to position the probe 400 and the electronic microscope 520 to conduct a vertical probing operation mode on a vertical circuit board 500. The circuit board 500 is positioned using two retainers 600 which respectively clamp left and right edges of the circuit board 600 and a bottom retainer 610 which clamps a bottom edge of the vertical circuit board 500. In this case, the second and third links 70, 90 are turned upwardly, and the position of the chuck head 260 is changed to direct the probe 400 toward the vertical circuit board 500. The probe system of the present invention provides the following advantages.

(1) Because different sizes of the platens 20 may be attached interchangeably to the legs 13 to support the probe positioner 30 and because the heights of the legs may be varied by stacking different numbers of the blocks 10, the probe 400 held by the probe positioner 30 may be used to conduct a horizontal or vertical probing operation mode on different sizes of horizontal circuit boards. Accordingly, the probe system according to the present invention is suitable for probing different sizes of circuit boards 500, especially large circuit boards.

(2) The probe system of the present invention may be assembled and installed conveniently and quickly without using hand tools.

(3) With the use of the xyz-axes position adjuster 50 the position of the probe 400 may be micro-adjusted relative to the circuit board 500, thereby increasing a testing accuracy of the probe 400.

(4) By manipulating the connector tightening knob 160 of the rotary connector 100, the first and second ball joints 80, 300 and the rotary connector 100 may be loosened and re-tightened simultaneously to adjust or change relative positions of the first, second and third links 60, 70, 90 and the chuck unit 200 so that the distance of the probe 400 from the xyz-axes position adjuster 50 and a pointing direction of the probe 400 may be adjusted or altered. Therefore, the probe system of the present invention exhibits high flexibility in terms of applications and is suitable for both horizontal and vertical probing operation modes.

(5) By manipulating the inclination adjusting screw 240, the position of the probe 400 held by the chuck head 260 may be micro-adjusted.

(6) By manipulating the chuck head clamping screw 250 to loosen and tighten the clamp elements 227, the chuck stem 262 may be released for removal of the chuck head 260 from the clamp elements 227, or for rotation relative to the clamp elements 227, which will induce rotation of the chuck head 260 to change angularly the pointing direction of the probe 400.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A probe system comprising:
    a plurality of spaced apart height-variable legs, each of which is composed of a stack of blocks magnetically attached to each other;
    a platen bridging and magnetically secured to the tops of said legs; and
    a probe positioner magnetically attached to the top of said platen,
    wherein said probe positioner includes a positioner base magnetically secured to the top of said platen, an xyz-axes position adjuster mounted on said positioner base, a first link connected to said xyz-axes position adjuster, a second link, a first ball joint interconnecting said first and second links, a third link, a rotary connector connected between said second and third links, a chuck unit, and a second ball joint connected between said third link and said chuck unit,
    wherein said xyz-axes position adjuster includes an adjuster base that is secured to said positioner base and that has a first guide rail extending in an x-axis direction, a first slide engaging slidably said first guide rail and having a second guide rail extending in a y-axis direction, a first adjuster screw attached rotatably to said adjuster base to extend in the x-axis direction and threadedly engaging said first slide, a second slide engaging slidably said second guide rail and having a third guide rail extending in a z-axis direction, a second adjuster screw attached rotatably to said first slide to extend in the y-axis direction and threadedly engaging said second slide, a third slide engaging slidably said third guide rail, and a third adjuster screw attached rotatably to said second slide to extend in the z-axis direction and threadedly engaging said third slide.

2. The probe system of claim 1, wherein each of said blocks includes a block body that is magnetizable, and at least one magnet attached to said block body.

3. The probe system of claim 2, further comprising a plurality of magnet plates, said platen being magnetizable, each of said magnet plates being disposed between and magnetically interconnecting said platen and one of said blocks of one of said legs.

4. The probe system of claim 1, wherein said positioner base includes a base body that is magnetizable, and at least one magnet disposed in a bottom side of said base body to magnetically connect said base body to said platen.

5. The probe system of claim 1, wherein said first link is connected to said third slide, said first ball joint has a first ball disposed on one end of said first link, a first ball socket receiving said first ball and disposed on one end of said second link, a second ball joint having a second ball disposed on said chuck, and a second ball socket disposed on one end of said third link and receiving said second ball.

6. The probe system of claim 5, wherein said second link has a second link hole extending longitudinally therein from said first ball socket to the other end of said second link, said third link having a third link hole extending longitudinally therein from said second ball socket to the other end of said third link, said rotary connector including a first sleeve that is disposed at said other end of said second link and that has a first sleeve hole, a second sleeve that is disposed at said other end of said third link and that has a second sleeve hole aligned with said first sleeve hole, two pusher rods, one of which extends through said second link hole from said first ball socket and into said first sleeve hole, and the other of which extends through said third link hole from said second ball socket and into said second sleeve hole, a first press member inserted movably into one of said first and second link sleeve holes and having a bore and a first cam face to contact one of said pusher rods, a second press member inserted movably into the other one of said first and second link sleeve holes and having a second cam face to contact the other one of said pusher rods, a tightening screw rod connected to said second press member and extending through said first and second sleeve holes and said bore of said first press member, and a connector tightening knob threadedly engaging said tightening screw rod at one side of said first press member opposite to said second press member, wherein, when said connector tightening knob is rotated relative to said tightening screw rod to move said first press member toward said second press member, said first and second cam faces respectively pressing said pusher rods against said first and second balls so that relative movements between said first and second sleeves, between said first ball and first ball socket, and between said second ball and second ball socket are prevented.

7. The probe system of claim 5, wherein said chuck unit includes a chuck end piece connected to said second ball, a chuck head clamp connected pivotally to said chuck end piece, a compression spring disposed between said chuck end piece and said chuck head clamp, an inclination adjusting screw attached to said chuck head clamp, and a chuck head clamped by said chuck head clamp, said chuck end piece having a base section connected to said second ball, and a first pivot section extending from said base section, said chuck head clamp including a second pivot section connected pivotally to said first pivot section and spaced apart from said base section, and a clamp section connected to said second pivot section, said second pivot section having two arm sections, a bight section interconnecting said arm sections, and a fulcrum groove defined by said arm and bight sections, said bight section having a screw hole communicated with said fulcrum groove, said first pivot section being fulcrumed to said arm sections in said fulcrum groove, said compression spring having two ends respectively abutting against said base section and said bight section, said inclination adjusting screw engaging threadedly said screw hole and extending to said pivot section, wherein, when said inclination adjusting screw is rotated to move inwardly into said fulcrum groove, an inclination angle between said chuck end piece and said chuck head clamp may be adjusted.

8. The probe system of claim 7, wherein said chuck head clamp further includes a chuck head clamping screw, said clamp section including two substantially parallel clamp elements projecting from said second pivot section, said chuck head clamping screw having a threaded section extending through said clamp elements, and an operating knob connected to said threaded section outwardly of said clamp section, said chuck head including a first jaw component, a chuck stem connected to said first jaw component and clamped between said clamp elements, and a second jaw component attached movably to said first jaw component, wherein, when said chuck head clamping screw is tightened, said clamp elements move toward each other and tightly clamp said chuck stem.

9. The probe system of claim 8, wherein said first jaw component has a first jaw plate and a first jaw leg extending transversely from one end of said first jaw plate, said chuck stem being connected to said first jaw leg, said second jaw component having a second jaw leg, and a second jaw plate and a second jaw foot extending transversely from said second jaw leg in a spaced apart manner, said first jaw plate being disposed between said second jaw plate and said second jaw foot, said second jaw leg having a guide hole formed therein, said first jaw component further having two guide bolts attached to said first jaw leg and extending through said guide hole, a guide block attached to said guide bolts at one side of said guide hole opposite to said first jaw leg, said second jaw component further having a jaw adjusting screw attached to said second jaw foot and having an end to abut against said first jaw plate, wherein, when said jaw adjusting screw is rotated to push said first jaw plate, a distance between said first and second jaw plates may be reduced.

10. A probe system comprising:
a support;
an xyz-axes position adjuster mounted on said support and capable of making linear movements relative to said support along directions of x-axis, y-axis and z-axis;
a first link having one end connected to said xyz-axes position adjuster;
a second link;
a first ball joint connected between one end of said second link and the other end of said first link;
a third link;
a chuck unit adapted to hold a probe;
a second ball joint connected between said chuck unit and one end of said third link; and
a rotary connector connected rotatably to the other end of said second link and to the other end of said third link,
wherein said chuck unit includes a chuck end piece connected to said second ball joint, a chuck head adapted to clamp the probe, a chuck head clamp clamping said chuck head and connected pivotally to said chuck end piece, and an inclination adjusting screw to adjust an inclination angle between said chuck head clamp and said chuck end piece.

11. The probe system of claim 10, wherein said chuck end piece has a base section connected to said second ball joint, a first pivot section extending from said base section, said chuck head clamp including a second pivot section that has a fulcrum groove, and a screw hole communicated with said fulcrum groove, said first pivot section fulcrumed to said second pivot section within said fulcrum groove, said chuck unit further including a biasing spring disposed between said base section and said second pivot section to provide a biasing force to induce a relative turning movement between said base and second pivot sections, said inclination adjusting screw engaging threadedly said screw hole and extending to said fulcrum groove to push said first pivot section so that a relative turning movement between said base and second pivot sections is induced against said biasing force.

12. The probe system of claim 10, wherein said chuck head includes a first jaw component, a chuck stem attached to said first jaw component and clamped by said chuck head clamp, and a second jaw component attached movably to said first jaw component, and a jaw adjusting screw to adjust a clamping distance between said first and second jaw components.

13. The probe system of claim 12, wherein said chuck head clamp further includes two clamp elements projecting from said second pivot section to clamp said chuck stem, and a chuck head clamping screw extending through said clamp elements to tighten or loosen said clamp elements relative to said chuck stem, said chuck stem being removable from said clamp elements when said clamp elements are loosened.

14. The probe system of claim 13, wherein said first jaw component has a first jaw leg, and a first jaw plate extending from one side face of said first jaw leg, said chuck stem attached to another side face of said first jaw leg to extend in a direction transverse to said first jaw plate, said second jaw component having a second jaw leg, and a second jaw plate and a second jaw foot extending transversely from said second jaw leg in a spaced apart manner, said first jaw plate being disposed between said second jaw plate and said second jaw foot, said jaw adjusting screw being attached to said second jaw foot and having one end to abut against said first jaw plate.

15. A probe system comprising:
   a support;
   a chuck unit adapted to hold a probe;
   a first link mounted on said support;
   a second link;
   a first ball joint having a first ball disposed on one end of said first link, and a first ball socket disposed on one end of said second link and receiving said first ball;
   a third link;
   a second ball joint having a second ball disposed on said chuck unit, and a second ball socket disposed on one end of said third link and receiving said second ball;
   a first sleeve disposed on the other end of said second link and having a first sleeve hole;
   a second sleeve disposed on the other end of said third link and having a second sleeve hole aligned with said first sleeve hole;
   two pusher rods, one of which extends through said second link from said first ball socket and into said first sleeve hole, and the other of which extends through said third link from said second ball socket and into said second sleeve hole;
   a first press member inserted movably into one of said first and second link sleeve holes and having a first cam face to contact one of said pusher rods;
   a second press member inserted movably into the other one of said first and second link sleeve holes and having a second cam face to contact the other one of said pusher rods;
   a tightening screw rod connected to said second press member and extending through said first press member and said one of said first and second sleeve holes; and
   a connector tightening knob disposed around said tightening screw rod at one side of said first press member opposite to said second press member and having a threaded hole threadedly engaging said tightening screw rod;
   wherein, when said connector tightening knob is rotated relative to said tightening screw rod to move said first press member toward said second press member, said first and second cam faces respectively press said pusher rods, said pusher rods respectively press said first and second balls, and said first and second sleeves are immobilized relative to each other.

16. The probe system of claim 15, wherein said second link has a second link hole extending longitudinally therein from said first ball socket to said second sleeve hole to receive movably one of said pusher rods, said third link having a third link hole extending longitudinally therein from said second ball socket to said third sleeve hole to receive movably the other one of said pusher rods.

17. The probe system of claim 16, wherein each of said first and second press members has a rounded peripheral surface in sliding contact with an inner surface of a respective one of said first and second sleeves, an inner end face formed transversely of said rounded peripheral surface within a respective one of said first and second sleeve holes, and a corner edge formed at a junction of said inner end face and said rounded peripheral surface, said corner edges of said first and second press members being notched to respectively form said first and second cam faces therein.

* * * * *